United States Patent [19]
Tsuji et al.

[11] Patent Number: 5,113,158
[45] Date of Patent: May 12, 1992

[54] PULSE WIDTH MODULATION CIRCUIT

[75] Inventors: Kimitoshi Tsuji; Yorikiyo Nobuhara, both of Toyota, Japan

[73] Assignee: Toyota Jidosha Kabushiki Kaisha, Toyota, Japan

[21] Appl. No.: 723,972

[22] Filed: Jul. 1, 1991

[51] Int. Cl.$^5$ .................... H03K 7/08; G05B 11/28
[52] U.S. Cl. ..................................... 332/109; 318/599
[58] Field of Search ................ 332/109; 180/79.1; 318/599, 684

[56]  References Cited
FOREIGN PATENT DOCUMENTS 146473 11/1981 Japan .
190010 9/1985 Japan .
234070 11/1985 Japan .
 41280 2/1988 Japan .
0917332 3/1982 U.S.S.R. ............................. 332/109

Primary Examiner—David Mis
Attorney, Agent, or Firm—Cushman, Darby & Cushman

[57] ABSTRACT

A pulse width modulation circuit includes an operation unit which generates a compensation signal based on the product of a deviation of an input signal from a first reference value and a deviation of a power supply voltage from a second reference. A level change unit changes the level of at least one of an error signal from an error amplifier and a reference wave signal generated by a reference wave signal generator in accordance with the compensation signal so that a relative level defined by a level difference between the error signal and the reference wave signal changes in accordance with the compensation signal. The pulse width modulation circuit also includes a unit for comparing the level of the error signal and the level of the reference wave signal having a changed relative level with each other and for generating a pulse width modulated signal based on a comparison result.

13 Claims, 7 Drawing Sheets

PULSE WIDTH MODULATION CIRCUIT

BACKGROUND OF THE INVENTION

(1) Field of the Invention

The present invention generally relates to pulse width modulation circuits, and more particularly to a pulse width modulation circuit which generates a pulse width modulated signal having a duty ratio which varies in accordance with the degree of error contained in an input signal.

(2) Description of the Related Art

A pulse width modulation circuit in which the duty ratio of a pulse width modulated signal varies in accordance with the degree of error included in an input signal is applied to, for example, a power steering control device of an automotive vehicle. The power steering control device is a device which controls the degree of force necessary to operate a steering wheel on the basis of a vehicle speed. Normally, the power steering control device operates by the pulse width modulation process. A pulse width modulated signal has a duty ratio which varies in accordance with the vehicle speed, and is supplied to a solenoid valve as an opening angle control signal. The solenoid valve is opened at an angle dependent on the duty ratio of the pulse width modulated signal, that is, the average of a driving current passing through a solenoid coil of the solenoid valve. The opening angle of the solenoid valve changes the size of a bypass oil passage of a power cylinder. When the steering wheel is turned very much or the vehicle is traveling at a low speed, the opening angle of the solenoid valve is controlled so that a light steering effort can be obtained. On the other hand, when the vehicle is traveling at a middle or high speed, the opening angle of the solenoid valve is controlled so that an appropriately heavy steering effort can be obtained.

The pulse width modulation circuit used for the above-mentioned power steering control device employs a feedback control in which the duty ratio of the pulse width modulated signal is adjusted on the basis of the difference (error degree) between the solenoid driving current and an input vehicle speed signal so that the above difference decreases. The solenoid driving current is obtained by detecting a voltage drop developed across a solenoid driving current detection resistor. However, the above-mentioned feedback control has a disadvantage in that if the detected solenoid driving current is much smaller than the real solenoid driving current due to, for example, a shortcircuiting of the solenoid driving current detection resistor, the error degree (difference) will be continuously greater than a predetermined threshold value. In such a case, the pulse width modulation circuit continuously generates the pulse width modulated signal having a maximum duty ratio (100%), so that an excessively large solenoid driving current passes through the solenoid coil.

In order to eliminate the above-mentioned problem, the feedback loop is disconnected from the pulse width modulation circuit when the error degree exceeds the predetermined threshold value, so that the duty ratio of the pulse width modulated signal is determined based on only the vehicle speed. Such a control is called an open-loop control and disclosed in, for example, Japanese Laid-Open Patent Publication No. 60-234070.

However, the pulse width modulation circuit disclosed in the above Japanese publication has a disadvantage in that the solenoid driving current increases as the power supply voltage increases because of an increase in a voltage generated by an alternator based on an increase in the vehicle speed. In order to suppress an increase in the solenoid driving current, a conventionally known pulse width modulation circuit shown in FIG. 1 is used.

Referring to FIG. 1, a vehicle speed signal from a vehicle speed sensor (not shown) is input to an error amplifier 2 via an input terminal 1. As shown in FIG. 2, the input vehicle speed signal is proportional to the vehicle speed, and equal to 3.6 V when the vehicle speed is 120 km/h. The error amplifier 2 compares the input vehicle speed signal with a signal dependent on a load current (solenoid driving current) which is input from an amplifier that will be described later. Then, the error amplifier 2 outputs an error (difference) signal to a terminal 3a of a switch circuit 3. The input vehicle speed signal applied to the input terminal 1 is directly input to a terminal 3b of the switch circuit 3. A comparator 4 compares the input vehicle speed signal with the error signal from the error amplifier 2, and outputs a select signal to the switch circuit 3. The select signal instructs the switch circuit 3 to connect the terminal 3b with a terminal 3c thereof when the error signal output by the error amplifier 2 is equal to or higher than the input vehicle speed signal applied to the input terminal 1 (in other words, when the degree of error is equal to or greater than a predetermined value). On the other hand, the select signal output by the comparator 4 instructs the switch circuit 3 to connect the terminal 3a and the terminal 3c when the error signal is lower than the input vehicle speed signal (in other words, when the error degree is less than the predetermined value).

When the error degree is less than the predetermined value, the output terminal of the error amplifier 2 is electrically coupled to the inverting input terminal of the error amplifier 2 via the terminals 3a and 3c of the switch circuit 3, a comparator 5, an inverter 7, a gate and source of an N-channel field effect transistor 8, a solenoid coil 9, a current detection resistor 10, resistors 12 and 14 and an amplifier 15. That is, a feedback loop including the above-mentioned circuit parts is established.

On the other hand, when the error degree is equal to or greater than the predetermined value, the output terminal of the error amplifier 2 is disconnected from the input of the comparator 5 due to the function of the switch circuit 3, so that the above-mentioned feedback loop is not established. In other words, an open loop is formed in which the input terminal 1 is coupled to the comparator 5, the inverter 7 and the gate of the field effect transistor 8 via the terminals 3b and 3c of the switch circuit 3.

The comparator 5 compares, at predetermined intervals, the level of a triangular wave signal generated by a triangular wave signal generator 6 with the level of the output signal of the switch circuit 3, and generates a pulse width modulated signal having a duty ratio based on the level of the output signal of the switch circuit 3. The pulse width modulated signal is inverted by the inverter 7, and then applied to the gate of the field effect transistor 8, so that the transistor 8 is turned ON or OFF.

The source of the field effect transistor 8 is grounded via the solenoid coil 9 and the current detection resistor 10 which are connected in series, and is connected to a cathode of a flywheel diode 11, an anode of which is grounded. During the time the field effect transistor 8 is ON, the solenoid driving current (load current) is allowed to pass through the solenoid coil 9. On the other hand, during the time the field effect transistor 8 is OFF, no current passes through the solenoid coil 9. In general, the load current dependent on the duty ratio of the pulse width modulated signal output by the inverter 7 passes through the solenoid coil 9.

The load current is converted into a voltage by the current detection resistor 10. The voltage developed across the current detection resistor 10 is voltage-divided by resistors 12 and 14. A voltage developed across the resistor 14 is amplified by an amplifier 15, and an amplified voltage is applied to the inverting input terminal of the error amplifier 2. As the vehicle speed increases, the level of the error signal output by the error amplifier 2 increases, so that the duty ratio of the pulse width modulated signal obtained at the output terminal of the inverter 7 increases. Thus, the ON period of the field effect transistor 8 per unit time is lengthened, and the load current passing through the solenoid coil 9 increases in response to an increase in the vehicle speed. Thereby, the opening angle of the solenoid valve increases, so that the size of the bypass oil passage of the power cylinder increases and the steering effort increases to an appropriate magnitude. When the vehicle speed does not change, the steering effort is maintained at the predetermined magnitude due to the feedback control.

On the other hand, a power supply voltage +B is divided by the resistors 13 and 14, and a divided voltage is applied to the input terminal of the amplifier 15. If the resistor 13 is not provided, the load current passing through the solenoid coil 9 during the ON period of the transistor 8 increases as the power supply voltage +B increases. Thus, it is impossible to suitably execute the power steering control. On the other hand, by using the resistor 13, it is possible to apply the divided voltage generated by the resistors 13 and 14 to the inverting input terminal of the error amplifier 2 via the amplifier 15 so that the level of the error signal decreases as the level of the output signal of the amplifier 15 increases since the error amplifier 2 subtracts the output signal of the amplifier 15 from the input vehicle speed signal. As a result, the duty ratio of the pulse width modulated signal decreases, so that an increase in the load current can be prevented. On the other hand, when the power supply voltage +B decreases, the circuit operates in a reverse way, so that a decrease in the load current can be prevented.

However, the above-mentioned conventional pulse width modulation circuit has a disadvantage as described below. When the difference between the input vehicle speed signal and the load current detection signal becomes equal to or greater than the predetermined value, the error amplifier 2 is disconnected by the switch circuit 3. At the same time, the divided voltage obtained by the resistors 13 and 14 is cut off, so that the circuit operation is affected by variations in the power supply voltage +B.

In order to eliminate the disadvantage mentioned above, an improved pulse width modulation circuit has been proposed (see Japanese Laid-Open Patent Publication No. 1-335390). Such an improved pulse width modulation circuit is shown in FIG. 3, in which those parts which are the same as those shown in FIG. 1 are given the same reference numerals. A triangular wave signal generator 20 generates a triangular wave signal having a central potential Vc based on the power supply voltage +B. As shown in FIG. 4, the triangular wave signal generated by the triangular wave signal generator 20 has a fixed period T and a fixed amplitude A.

On the other hand, the output signal of the switch circuit 3 has a voltage higher than the central potential Vc, as indicated by Vi' shown in FIG. 4(A). Thus, as shown in FIG. 4(B), the output signal of the inverter 7 has a low level while the triangular wave signal indicated by 'a' has a level equal to or higher than the output signal Vi'. On the other hand, the output signal of the inverter 7 has a high level while the triangular wave signal 'a' has a level (approximately equal to a value Vo of the power supply voltage +B obtained at this time) lower than the output signal Vi'. Thus, the output signal of the switch circuit 3 is a pulse train 'b' shown in FIG. 4(B). The pulse train 'b' having the wave height Vo has the fixed period T and a pulse width D which has been modulated by the output signal Vi' of the switch circuit 3, and corresponds to the above-mentioned pulse width modulated signal. The duty ratio now labeled Do (=D/T) increases as the level of the input vehicle speed signal increases (that is, as the vehicle speed increases) since the level of the output signal Vi' of the switch circuit 3 increases.

At this time, an average current $i_o$ defined by the following formula (1) passes through the solenoid coil 9:

$$i_o = Vo.Do/R \qquad (1)$$

where Vo is the power supply voltage +B, Do is the duty ratio of the pulse width modulated signal, and R is the resistance of the solenoid coil 9.

When the power supply voltage +B increases from Vo to Vo(1+α) under the condition where the vehicle is traveling at a constant speed, the central potential of the triangular wave signal 'a' output by the triangular wave signal generator 20 increases in response to the increase in the power supply voltage +B, as indicated by Vc' shown in FIG. 5(A), and becomes almost the same as the output signal Vi' of the switch circuit 3. As a result, the pulse width modulated signal output by the comparator 5 is changed so that, as shown in FIG. 5(B), the wave height is equal to Vo(1+α) and the duty ratio is equal to Do(1−β) (=D(1−β)/T where β is a duty ratio variation rate. Thus, an average current i' defined by the following formula (2) passes through the solenoid coil 9:

$$i' = Vo(1+\alpha)Do(1-\beta)/R \qquad (2)$$

According to the proposed circuit disclosed in Japanese Laid-Open Patent Publication No. 1-335390, the duty ratio variation rate β is controlled so that the duty ratio decreases as the power supply voltage +B increases. Thus, the average currents i and i' become almost equal to each other. Even if the error amplifier 2 is disconnected when the error degree is equal to or greater than the predetermined value, the circuit can reduce the influence of variations in the power supply voltage +B.

FIG. 6 is a graph in which the horizontal axis represents the above-mentioned coefficient α and the power supply voltage +B, and the vertical axis represents the error degree defined by $i'/i_o$. Characteristic curves I, II and III relate to duty ratios Do(1−β) of 20%, 50% and 80%, respectively. Thus, the amount of compensation depends on the duty ratio Do(1−β). Thus, a small amount of compensation is determined for a large duty ratio, and a large amount of compensation is determined for a small duty ratio.

SUMMARY OF THE INVENTION

It is a general object of the present invention to provide an improved pulse width modulation circuit in which the above-mentioned disadvantages are eliminated.

A more specific object of the present invention is to provide a pulse width modulation circuit in which variations in the load current, such as a solenoid driving current, arising from variations in the power supply voltage can be suppressed effectively.

The above-mentioned objects of the present invention are achieved by a pulse width modulation circuit comprising:

error amplifier means for generating an error signal corresponding to a difference between an input signal and a compare signal;

operation means for generating a compensation signal based on a product of a deviation of the input signal from a first reference value and a deviation of a power supply voltage from a second reference value;

reference wave signal generating means for generating a reference wave signal having a fixed period and a fixed amplitude;

level change means, operatively coupled to the error amplifier means and the reference wave signal generating means, for changing a level of at least one of the error signal and the reference wave signal in accordance with the compensation signal so that a relative level defined by a level difference between the error signal and the reference wave signal changes in accordance with the compensation signal;

compare means, operatively coupled to the level change means, for comparing the level of the error signal and the level of the reference wave signal having a changed relative level with each other and for generating a pulse width modulated signal based on a comparison result;

current supply means, coupled to the compare means, for supplying a load current based on a duty ratio of the pulse width modulated signal to a load; and load current detection means, operatively coupled to the error amplifier means, for detecting the load current passing through the load and for generating the compare signal based on a detected load current.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 7:
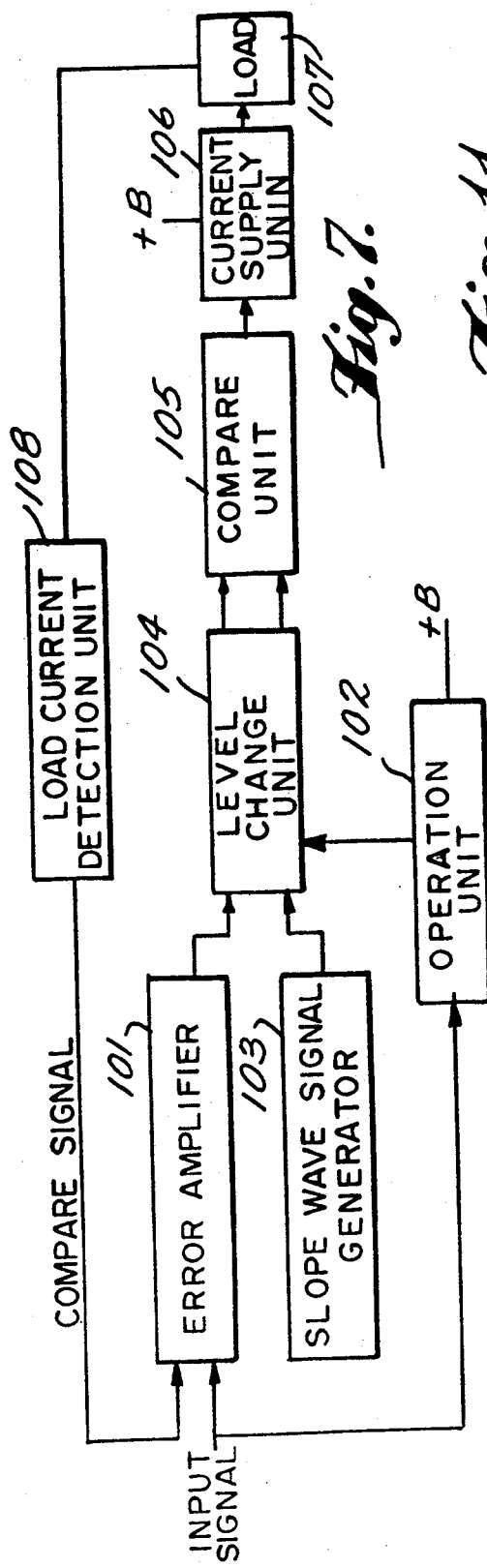
FIG. 7 is a block diagram showing the principle of a pulse width modulation circuit according to the present invention.

Referring to FIG. 7, the pulse width modulation circuit according to the present invention has an error amplifier 101, an operation unit 102, a slope wave signal generator 103, a level change unit 104, a comparator 105, a current supply unit 106, a load 107 and a load current detection unit 108. The error amplifier 101 generates an error signal which indicates the difference between an input signal and a compare signal. The operation unit 102 generates a compensation signal based on the product of a deviation of the input signal from its reference value and a deviation of a power supply voltage from its reference power supply voltage. The slope wave signal generator 103 generates a slope wave signal having a constant period and a constant amplitude, such as a triangular wave signal. The level change unit 104 changes a relative level between the error signal and the slope wave signal in accordance with the output signal of the operation unit 102. The comparator 105 compares the levels of the error signal and the slope wave signal having the changed relative level with each other, and generates a pulse width modulated signal. The current supply unit 106 allows a load current (average current dependent on the duty ratio of the pulse width modulated signal) to pass through the load 107, such as a solenoid coil. The load current detection unit 108 detects the load current, and outputs, as the aforementioned compare signal, a signal based on the detected load current to the error amplifier 101.

The level change unit 104 relatively changes at least one of the levels of the error signal from the error amplifier 101 and the slope wave signal from the slope wave generator 103 so that the amount of compensating for the load current based on a variation in the power supply voltage +B cancels (in other words, is inversely proportional to) the amount of compensating for the load current based on a variation in the input signal. As a result, it is possible to compensate for the load current irrespective of the duty ratio of the pulse width modulated signal.

The level change unit 104 is comprised of, for example, a circuit which changes the central potential of the slope wave signal generated by the slope wave signal generator 103 in accordance with the output signal (compensation signal) of the operation unit 102.

Alternatively, the level change unit 104 is comprised of a circuit which changes a D.C. (direct current) level of the error signal output by the error amplifier 101 in accordance with the output signal of the operation unit 102.

Figure 1:
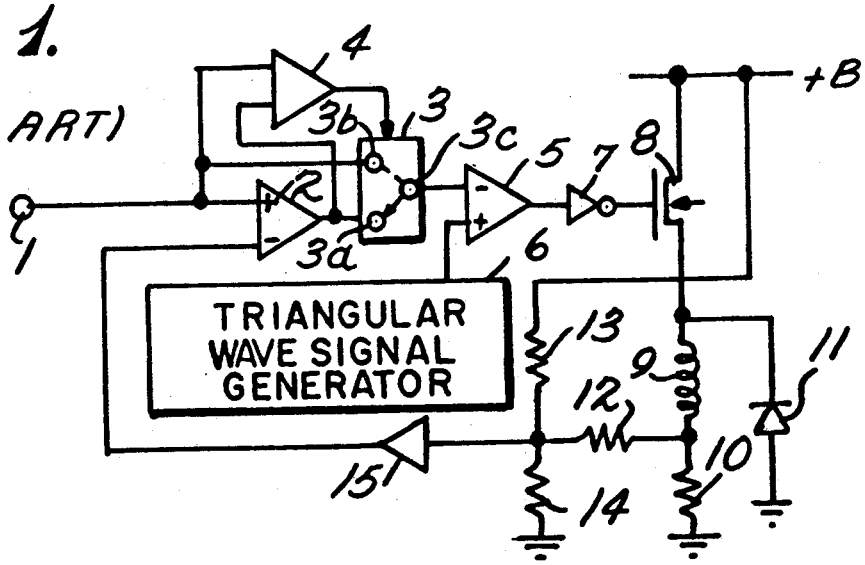
FIG. 1 is a circuit diagram of a conventional pulse width modulation circuit.
Figure 2:
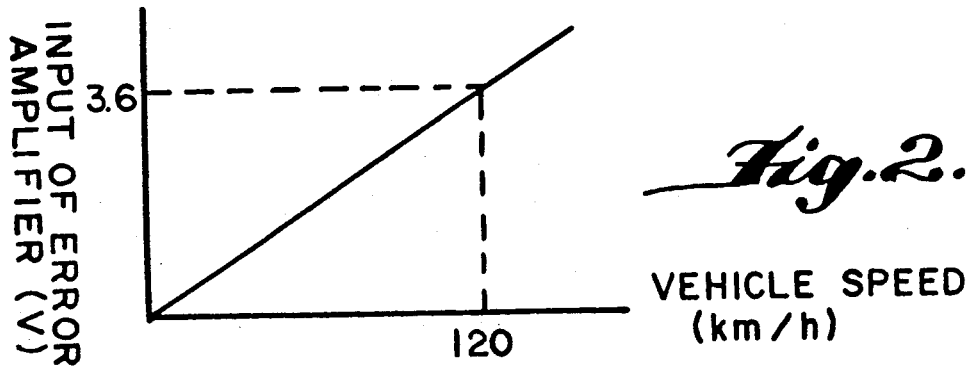
FIG. 2 is a graph showing a relationship between an input of an error amplifier shown in FIG. 1 and a vehicle speed.
Figure 8:
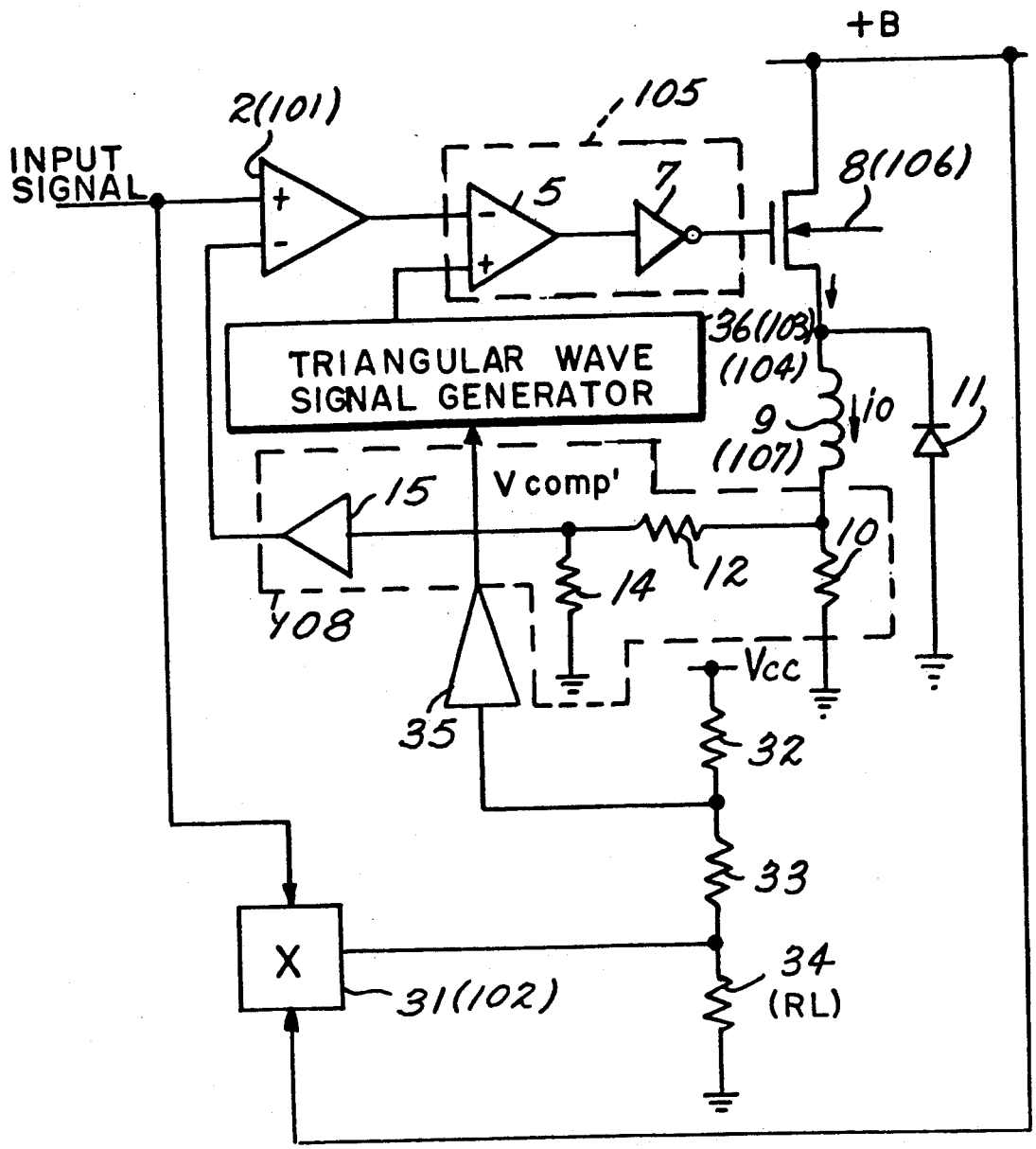
FIG. 8 is a circuit diagram of a first preferred embodiment of the present invention.

FIG. 8 illustrates the pulse width modulation circuit shown in FIG. 7 in more detail. In FIG. 8, those parts which are the same as those shown in FIG. 1 are given the same reference numerals. An analog multiplier 31, which corresponds to the operation unit 102 shown in FIG. 7, multiplies the input signal by the power supply voltage +B, and outputs a multiplied signal to a node where resistors 33 and 34 are connected in series. A series circuit consists of three resistors 32, 33 and 34, and is connected between a power supply voltage Vcc and the ground. A node where the resistors 32 and 33 are connected in series is coupled to a control terminal of a triangular wave signal generator 36 via an amplifier 35.

Figure 3:
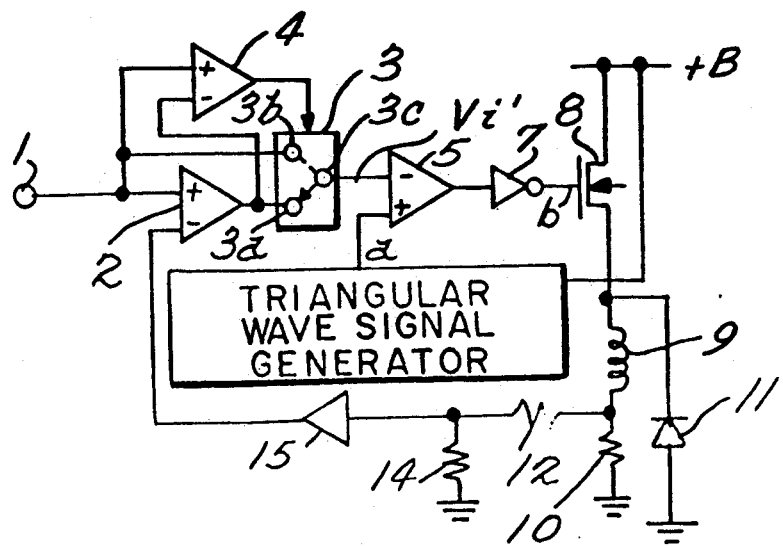
FIG. 3 is a circuit diagram of another conventional pulse width modulation circuit.
Figure 4:
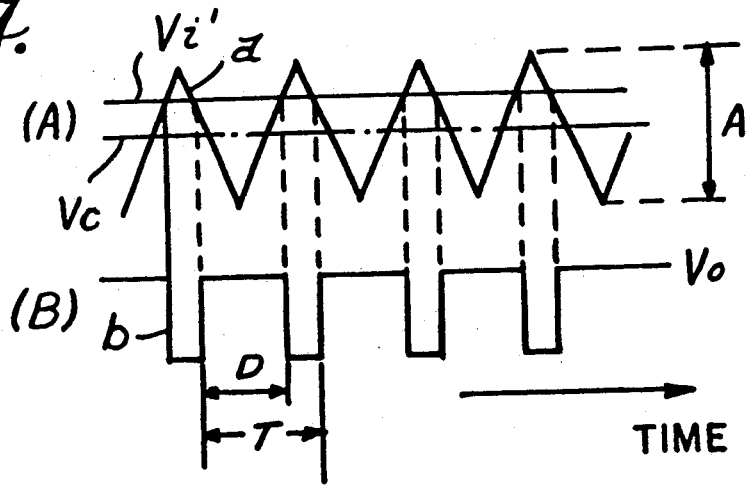
FIG. 4 is a waveform diagram showing the operation of the pulse width modulation circuit shown in FIG. 3.
Figure 5:
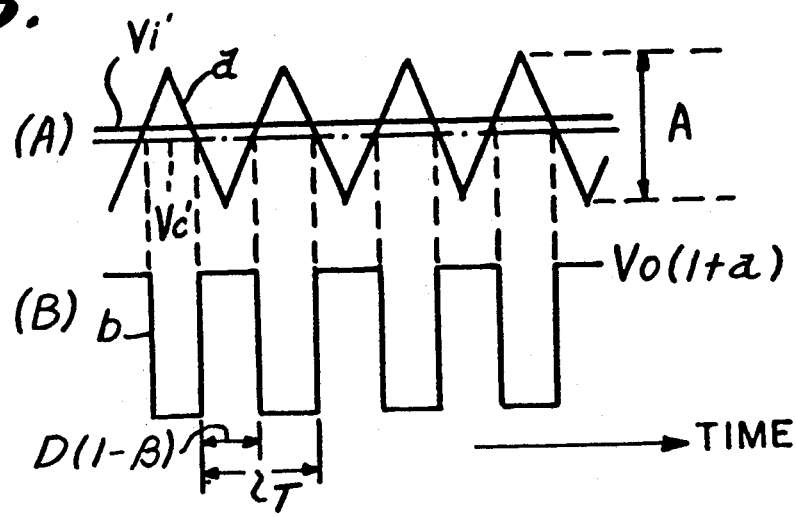
FIG. 5 is another waveform diagram showing the operation of the pulse width modulation circuit shown in FIG. 3.

The triangular wave signal generator 36 corresponds to the slope wave signal generator 103 and the level change unit 104 shown in FIG. 7, and generates a triangular wave signal which has a central potential varying in accordance with an output voltage Vcomp of the amplifier 35 and which has a fixed period and a fixed amplitude. The triangular wave signal is input to a non-inverting input terminal of the comparator 5, which forms, together with the inverter 7, the compare unit 105 shown in FIG. 7. It should be noted that the central potential of the triangular wave signal generated by the triangular wave signal generator 36 does not change in accordance with the power supply voltage +B but instead changes in accordance with the output signal of the analog multiplier 31. It will be noted that the aforementioned switch circuit 3 and the comparator 4 shown in FIG. 3 are omitted because they do not relate to the essential features of the present invention. However, it is possible to place these parts between the error amplifier 2 and the comparator 5.

The analog multiplier 31 multiplies the input signal indicative of the vehicle speed by the power supply voltage +B, and is provided for the following reason. In the circuit shown in FIG. 3, the average current i' defined by formula (2) passes through the solenoid coil 9 (which corresponds to the load 107) because the central potential of the triangular wave signal is made to change in accordance with a variation in the power supply voltage +B. In the aforementioned description, it is assumed, for the sake of simplicity, that the input signal Vi' of the comparator 5 is fixed and only the power supply voltage +B increases to $V_o(1+\alpha)$ from $V_o$. Thus, in order to suppress the influence of variations in the power supply voltage +B, it is necessary to make the average current i' equal to $i_o$.

The duty ratio change rate $\beta$ used in the aforementioned formula (2) is a coefficient which shows how much a variation in the power supply voltage +B causes a change in the duty ratio, and is defined by the following formula:

$$\beta = [V_o(1+\alpha) - V_o]/(A.D_o.N) \quad (3)$$

where N is a compensation voltage coefficient used for calculating an amount of compensation of the power supply voltage +B from the amount of variation in the power supply voltage +B. That is, (+B compensation amount) = (+B variation amount)/N. In formula (3), A is the amplitude of the triangular wave signal.

It can be seen from formula (3) that the duty ratio change rate $\beta$ is a coefficient obtained by normalizing the +B compensation voltage $[V_o(1+\alpha) - V_o]/N$ by the amplitude A of the triangular wave signal as well as the duty ratio Do obtained before the compensation of the power supply voltage +B is carried out.

On the other hand, a current variation rate $i'/i_o$ is defined as follows:

$$i'/i_o = (1+\alpha)(1-\beta) \quad (4)$$

where $i_o$ is the average current obtained before the compensation of the power supply voltage +B is carried out, and i' is the average current obtained after the compensation of the power supply voltage +B is carried out. By deleting $\beta$ in formula (4) by using formula (3), the following formula is obtained:

$$i'/i_o = -(V_o/D_o.N.A)(\alpha+1)[\alpha - (D_o N A/V_o)] \quad (5)$$

Figure 6:
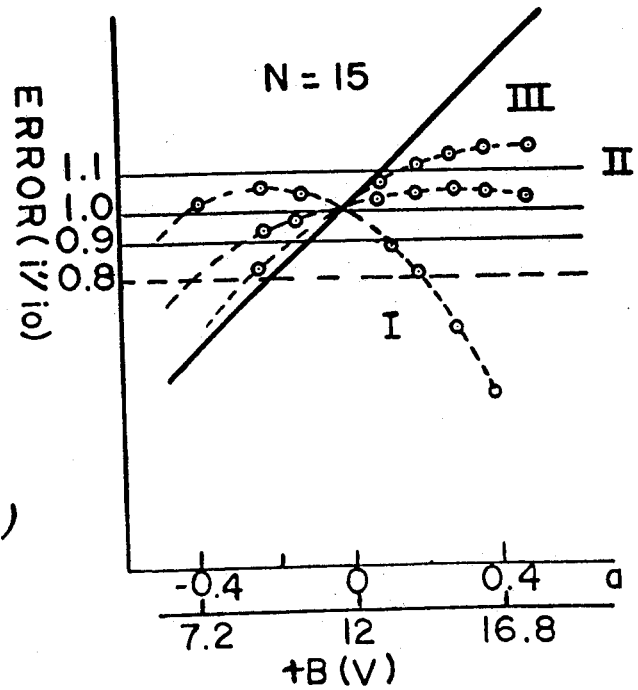
FIG. 6 is a graph showing a relationship between a power supply voltage and variations in an average current passing through a solenoid coil.

In the graph of FIG. 6, the current variation rate $i'/i_o$ is represented by the vertical axis, the coefficient $\alpha$ and the power supply voltage +B are represented by the horizontal axis, and N is set equal to 15. It can be seen from the graph of FIG. 6 that the current variation rate $i'/i_o$ changes along a quadratic function in which the secondary coefficient and the vertex thereof change in accordance with the duty ratio. Thus, when the compensation amount (compensation voltage) with respect to the power supply voltage is inversely proportional to the duty ratio Do, the aforementioned formula (5) is independent of the duty ratio. With the above in mind, the relationship between the compensation voltage coefficient N and the duty ratio Do is defined as follows:

$$N = K1/D_o \quad (6)$$

where K1 is a constant. By inserting formula (5) into formula (6), the following is obtained:

$$i'/i_o = (1+\alpha)[1-(V_o.\alpha)/(K1.A)] = -(V_o/K1.A)\alpha^2 + [1-(V_o/K1. A)]\alpha + 1 \quad (7)$$

Figure 9:
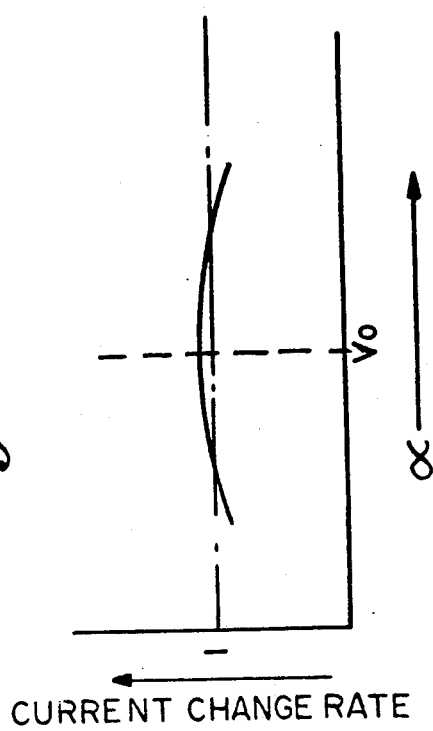
FIG. 9 is a graph showing a relationship between an error current and a variation in a power supply voltage.

FIG. 9 is a graph showing the formula (7) in which the vertical axis of the graph represents the current change rate $i'/i_o$ and the horizontal axis thereof represents the variation $\alpha$ in the power supply voltage +B. The solid line shown in FIG. 9 shows the formula (7). The current change rate $i'/i_o$ changes along a single quadratic function irrespective of changes in the duty ratio. Thus, it is possible to make the average currents i' and $i_o$ substantially equal to each other with respect to variations in the duty ratio and variations in the power supply voltage +B by selecting the values of the coefficients in the quadratic function of the formula (7).

+B compensation amount is defined by the product of the amount of deviation from the reference voltage (12 volts, for example) of the power supply voltage +B and the amount of deviation from the reference value (50%, for example) from the duty ratio. That is:

$$(+B\text{ compensation amount}) = (+B\text{ deviation amount})/N = (+B\text{ deviation amount})Do/K1.$$

The analog multiplier 31 is provided for calculating the above +B compensation amount.

Figure 10:
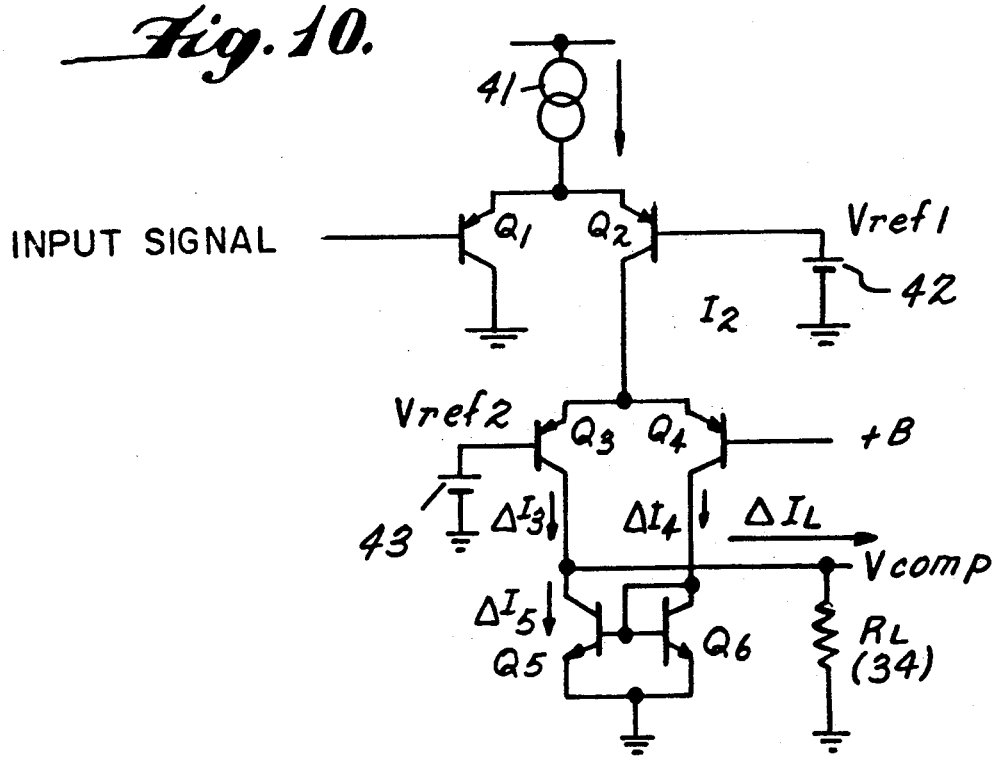
FIG. 10 is a circuit diagram of an analog multiplier shown in FIG. 8.

FIG. 10 is a circuit diagram showing the principle of the analog multiplier 31. The circuit shown in FIG. 10 has transistors Q1-Q6. The emitters of the PNP transistors Q1 and Q2 are coupled to a constant-current source 41 and form a first differential amplifier. The collector of the transistor Q2 is coupled to the emitters of the PNP transistors Q3 and Q4. The bases of the NPN transistors Q5 and Q6 are coupled to each other and to the collector of the PNP transistor Q6. The emitters of the transistors Q5 and Q6 are grounded and form a current mirror circuit. The collectors of the transistors Q5 and Q6 are coupled to the collectors of the transistors Q3 and Q4, respectively. The transistors Q3 and Q4 form a second differential amplifier in which the current mirror circuit composed of the transistors Q3 and Q4 serves as a load of the second differential amplifier.

An input signal, such as The input vehicle speed signal, is applied to the base of the transistor Q1, and a reference voltage Vref1 generated by a D.C. power source 42 is applied to the base of the transistor Q2. The reference voltage Vref1 corresponds to a level of the input vehicle speed signal obtained with the duty ratio equal to 50%. When the input vehicle speed signal applied to the base of the transistor Q1 has a level equal to the reference voltage Vref1, mutually identical currents pass through the transistors Q1 and Q2. When the level of the input vehicle speed signal applied to the base of the transistor Q1 becomes higher than the reference voltage Vref1, the collector current of the transistor Q1 decreases, and the collector current of the transistor Q2 increases complementarily. On the other hand, when the level of the input vehicle speed signal becomes lower than the reference voltage Vref1, the collector current of the transistor increases, and the collector current of the transistor Q2 decreases complementarily.

Figure 11:
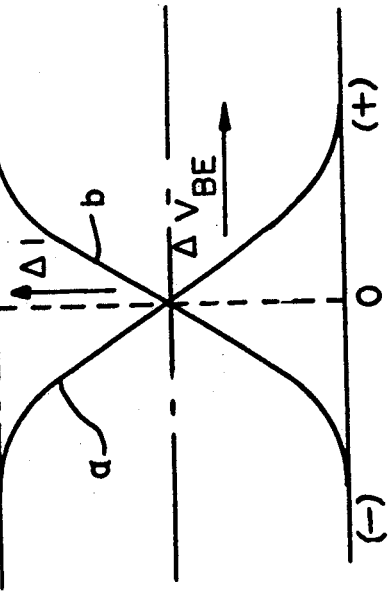
FIG. 11 is a graph showing a differential operation characteristic of the analog multiplier shown in FIG. 10.

FIG. 11 is a graph in which the horizontal axis thereof represents a difference $\Delta V_{BE1}$ (indicated as $\Delta V_{BE}$ in FIG. 11) between the level of the input vehicle speed signal and the reference voltage $\Delta V\text{ref1}$ and the vertical axis represents the collector currents of the transistors Q1 and Q2. The collector current of the transistor Q1 changes, as indicated by 'a' in FIG. 11, and the collector current (indicated as $\Delta_{I2}$ in FIG. 10) of the transistor Q2 changes, as indicated by 'b' in FIG. 11.

The collector current $\Delta I2$ of the transistor Q2 changes in proportion to a change in the voltage difference $\Delta V_{BE1}$ within a linear portion of the characteristic 'b' shown in FIG. 11. Thus, the collector current $\Delta I2$ showing a deviation of the input vehicle speed signal for the 50% duty ratio is as follows:

$$\Delta I2 = \Delta V_{BE1} \cdot K2 \cdot I_{BIAS} \tag{8}$$

where K2 is a constant, and $I_{BIAS}$ is a current half, the constant current passing through the constant-current source 41. The collector current $\Delta I2$ is respectively supplied to the emitters of the transistors Q3 and Q4. On the other hand, a reference voltage Vref2 generated by a D.C. power source 43 is applied to the base of the transistor Q3. The power supply voltage +B is applied to the base of the transistor Q4. The differential amplifier composed of transistors Q3 and Q4 has a differential operation characteristic similar to that of the differential amplifier composed of transistors Q1 and Q2. A collector current $\Delta I4$ of the transistor Q4 changes in accordance with a difference $\Delta V_{BE2}$ (indicated as $\Delta V_{BE}$ shown in FIG. 11) between the power supply voltage +B and the reference voltage Vref2, as indicated by the solid line 'a' shown in FIG. 11. Further, a collector current $\Delta I3$ of the transistor Q3 changes in accordance with the difference $\Delta V_{BE2}$, as indicated by the solid line 'b' shown in FIG. 11. When the voltage difference $\Delta V_{BE2}$ is zero, $\Delta I3 = \Delta I4 = \Delta I2/2$. Thus, the collector currents $\Delta I3$ and $\Delta I4$ respectively showing deviations from the reference voltage Vref2 regarding the power supply voltage +B are expressed as follows in a linear portion of the differential operation characteristic shown in FIG. 11:

$$\Delta I3 = \Delta V_{BE2} \cdot K3 \cdot \Delta I2 \tag{9}$$

$$\Delta I4 = \Delta V_{BE2} \cdot K4 \cdot \Delta I2 \tag{10}$$

where K3 and K4 are respectively constants.

On the other hand, a collector current $\Delta I5$ of the transistor Q5 is always equal to a collector current $\Delta I6$ of the transistor Q6 since the transistors Q5 and Q6 form the current mirror circuit. The collector of the transistor Q3 is connected to a resistor $R_L$ used for generating a compensation voltage Vcomp (which corresponds to the resistor 34 shown in FIG. 8). Thus, a current defined by the following formula passes through the resistor $R_L$:

$$\Delta I_L = \Delta I3 - \Delta I5 = \Delta I3 - \Delta I4 \tag{11}$$

By inserting formulas (8), (9) and (10) into formula (11) in order to delete $\Delta I2$, the following is obtained:

$$\Delta I_L = \Delta V_{BE2} \cdot K5 \cdot \Delta V_{BE1} \cdot K2 \cdot I_{BIAS} \tag{12}$$

where K5 is a constant indicated by (K3-K4).

It can be seen from formula (12) that the current $\Delta I_L$ corresponding to the product of $\Delta V_{BE1}$ and $\Delta V_{BE2}$ passes through the resistor $R_L$, and the compensation voltage Vcomp defined by the following formula is developed across the resistor $R_L$:

$$\begin{aligned} V\text{comp} &= \Delta I_L \cdot R_L \\ &= K6 \cdot \Delta V_{BE} \cdot \Delta V_{BE2} \cdot I_{BIAS} \cdot R_L \end{aligned} \tag{13}$$

The compensation voltage Vcomp defined by formula (13) is input to the triangular wave signal generator 36 via the resistor 33 and the amplifier 35.

The triangular wave signal generator 36 is composed of a generator (corresponding to the slope wave signal generator 103 shown in FIG. 7), which generates a triangular wave signal having a fixed period T and a fixed amplitude A, and an adder (corresponding to the level change unit 104 shown in FIG. 7) which superimposes a compensation voltage Vcomp' output by the amplifier 35 on the triangular wave signal generated by the above generator. This adder outputs a compensated triangular wave signal having a central potential equal to the compensation voltage Vcomp' to the non-inverting input terminal of the comparator 5.

Figure 12:
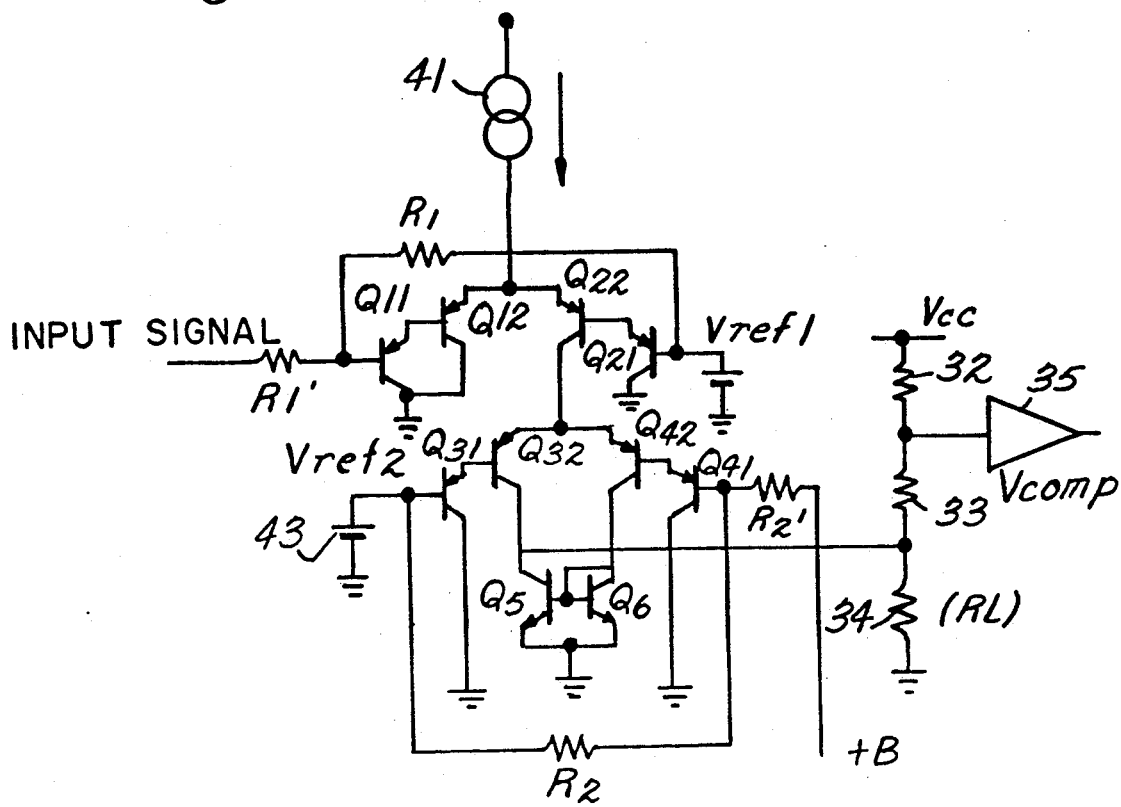
FIG. 12 is a circuit diagram showing the structure of the analog multiplier in more detail.

FIG. 12 is a circuit diagram showing the structure of of the analog multiplier 31 in more detail. In FIG. 12, those parts which are the same as those shown in FIGS. 8 and 10 are given the same reference numerals. The transistors Q1, Q2, Q3 and Q4 shown in FIG. 10 are Darlington circuits respectively composed of Darlington-connected transistors Q11 and Q12, Q21 and Q22, Q31 and Q32, Q41 and Q42. The Darlington circuits can operate in response to even a small input level. Further, a resistor R1 is connected between the basis of the transistors Q11 and Q21, and a resistor R2 is connected between the basis of the transistors Q31 and Q41, so that the amplification factor reduces to a desired value.

Figure 13:
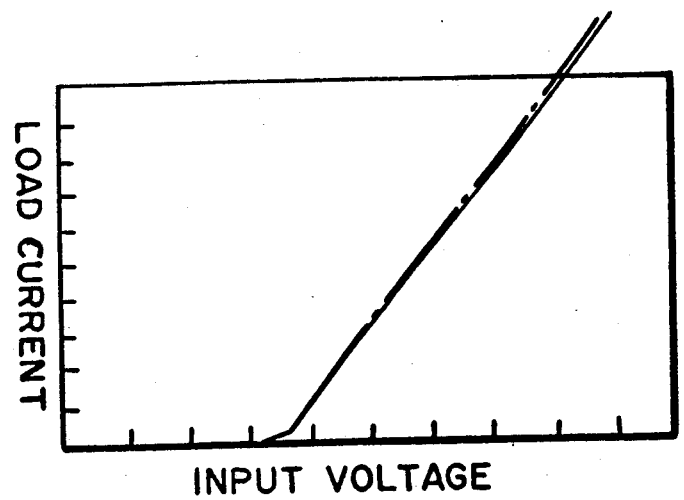
FIG. 13 is a graph showing load current vs. input voltage characteristics of the circuit according to the first embodiment of the present invention.

FIG. 13 is a graph showing a relationship between the load current (solenoid driving current) and the input voltage (input vehicle speed signal) obtained by the above-mentioned first embodiment of the present invention. The load current substantially linearly increases as the input vehicle speed signal increases for different power supply voltages +B equal to 12 V, 14 V, 16V and 18V. That is, even if the input duty ratio changes, the load current little changes. The variation in the load current is suppressed to about 0.5% for the +50% variation in the power supply voltage +B when the circuit is normally operating.

Figure 14A:
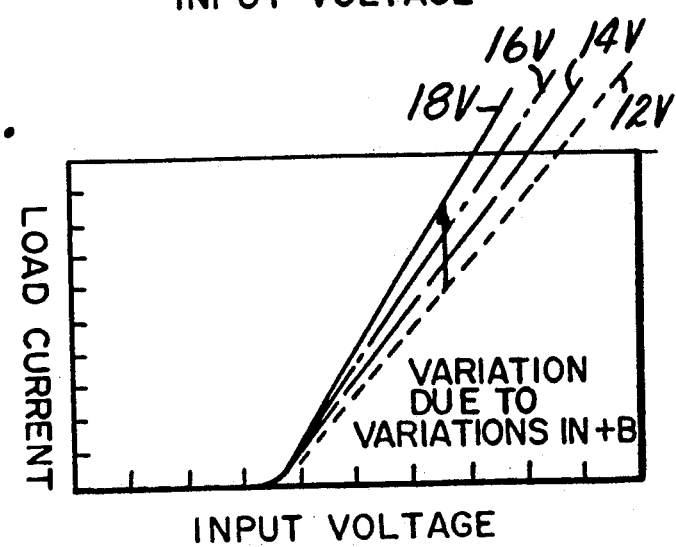
FIGS. 14A and 14B are respectively graphs showing load current vs. input voltage characteristics of conventional circuits.
Figure 14B:
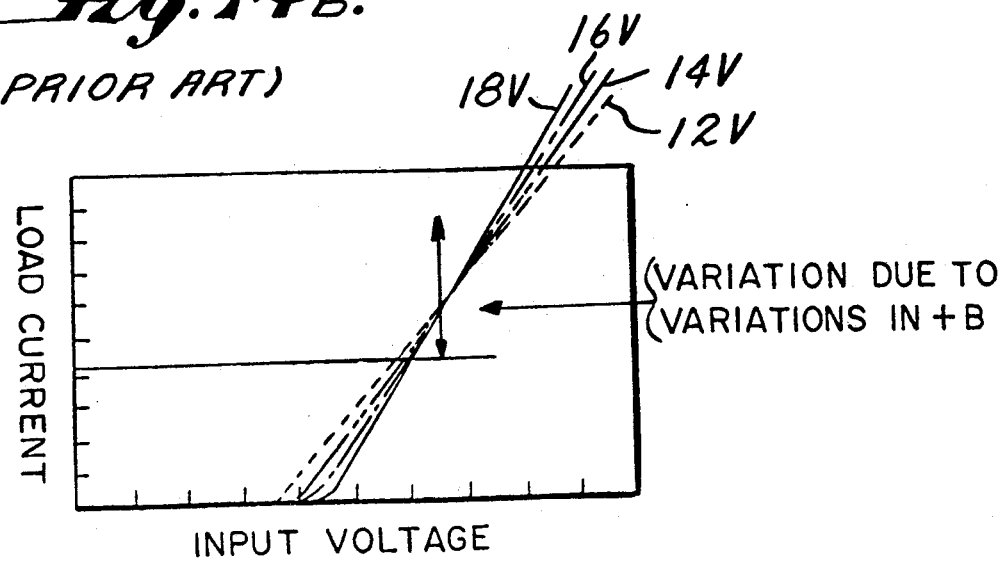

FIG. 14A is a graph showing the load current vs. input voltage obtained when no compensation control is carried out. FIG. 14B is a graph showing the load current vs. input voltage obtained by the conventional pulse width modulation circuit disclosed in Japanese Laid-Open Patent Publication No. 1-335390. In each of FIGS. 14A and 14B, the load current greatly varies within a range indicated by the arrow for the different values of the power supply voltage +B. It will be noted that the characteristics shown in FIGS. 13, 14A and 14B are obtained in the state where the feedback loop is opened (cut off) in order to clearly show the differences among them.

A description will now be given of a second embodiment of the present invention with reference to FIG. 15, in which those parts which the same as those shown in FIGS. 1 and 7 are given the same reference numerals. The pulse width modulation circuit shown in FIG. 15 includes a variable offset voltage follower 51 and an operation circuit 52, which correspond to the aforementioned level change unit 104 and the operation unit 102, respectively. The variable offset voltage follower 51 superimposes an output signal (offset voltage) of the operation circuit 52 on the error signal output by the error amplifier 2. Further, the circuit shown in FIG. 15 includes resistors 53 and 54 used for dividing the power supply voltage +B, and an amplifier 55 for detecting a variation in the power supply voltage +B. Furthermore, the circuit in FIG. 15 includes resistors 56 and 57 for setting the gain of the error amplifier 2.

The input vehicle speed signal is input to not only the non-inverting input terminal of the error amplifier 2 but also the operation circuit 52, which is also supplied with a voltage obtained by dividing the power supply voltage +B by the resistors 53 and 54 and amplifying a divided voltage to a predetermined level. The operation circuit 52 generates a signal dependent on the product of a deviation of the input vehicle speed signal from its reference value and a deviation of the power supply voltage +B from its reference value. The compensation signal generated by the operation circuit 52 is input to the variable offset voltage follower 51 as an offset voltage.

Figure 15:
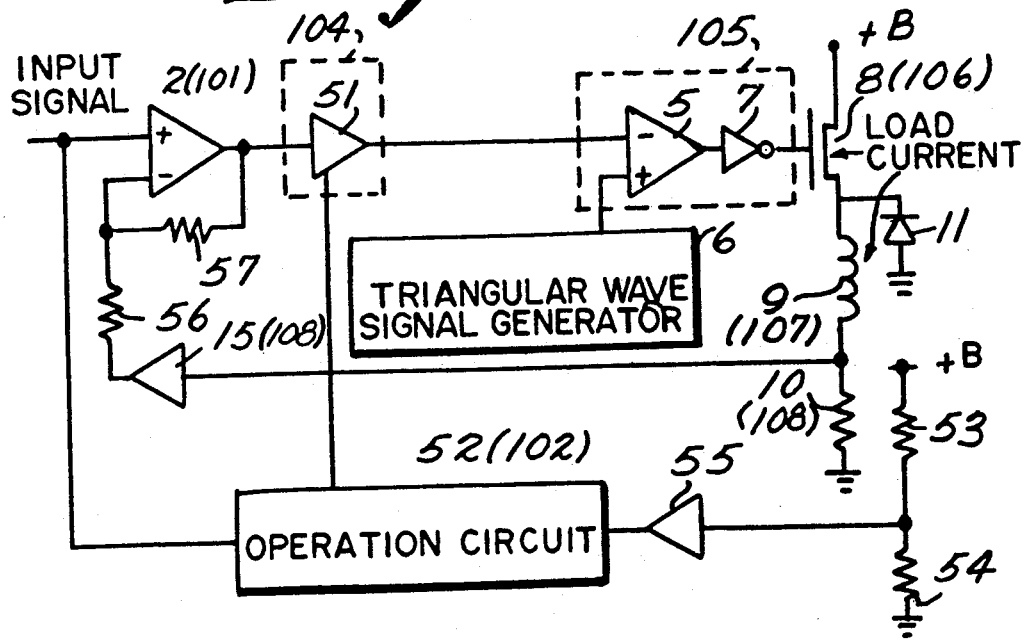
FIG. 15 is a circuit diagram of a second preferred embodiment of the present invention.
Figure 16:
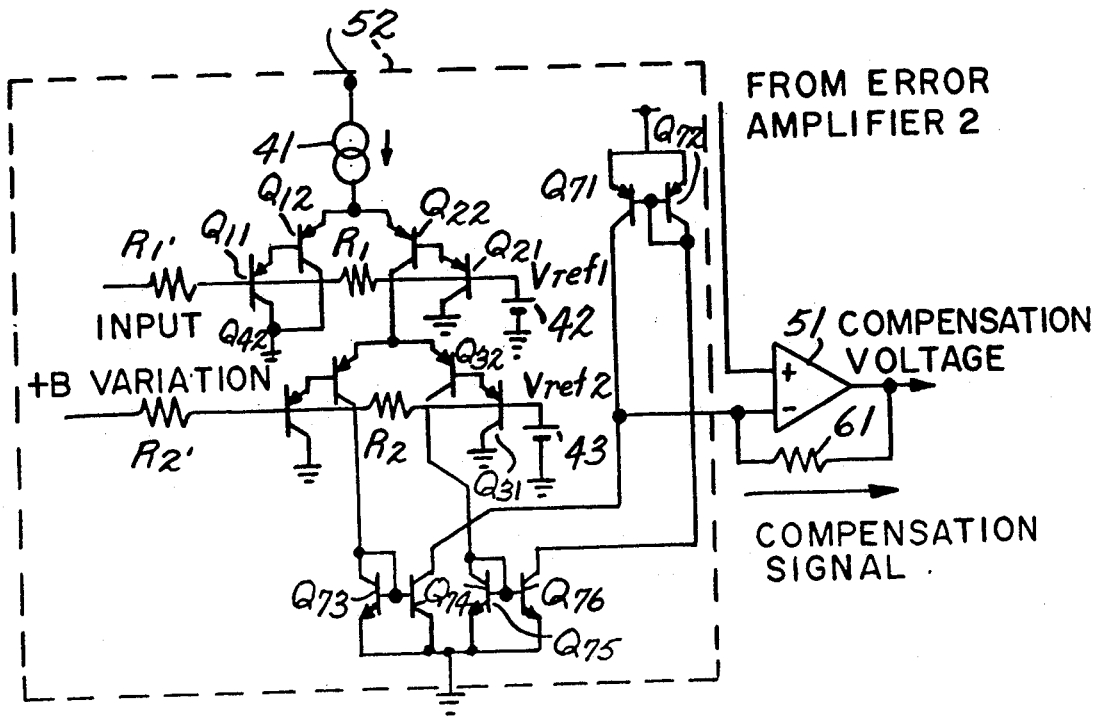
FIG. 16 is a circuit diagram of an operation circuit shown in FIG. 15.

FIG. 16 is a circuit diagram of the operation circuit shown in FIG. 15. In FIG. 16, those parts which are the same as those shown in FIGS. 12 and 15 are given the same reference numerals. In FIG. 16, PNP transistors Q71 and Q72 form a current mirror circuit, and serves as a constant-current sources for NPN transistors Q73, Q74, Q75 and Q76. The bases of the transistors Q73 and Q74 are connected to each other and to the collectors of the transistor Q74 and Q42. The collector of the transistor Q74 is connected to the collector of the transistor Q71. Similarly, the bases of the transistors Q75 and Q76 are connected to each other and to the collectors of the transistors Q74 and Q32. The collector of the transistor Q76 is connected to the base and collector of the transistor Q72. The collectors of the transistors Q71 and Q74 are connected to the inverting input terminal of the variable offset voltage follower 51.

The operation circuit 52 extracts, as a compensation current, a current from a connection node where the collectors of the transistors Q71 and Q74 are connected together. The extracted current is based on the product of the deviation of the input vehicle speed signal from its reference voltage Vref1 and the deviation of the power supply voltage +B from its reference voltage Vref2 with the duty ratio equal to 50%. The extracted current is converted into a compensation voltage by the resistor 61 connected to the output terminal and inverting input terminal of the variable offset voltage follower 51.

On the other hand, the non-inverting input terminal of the voltage follower 51 is supplied with the error signal output by the error amplifier 2. The voltage follower 51 amplifies the error signal with the gain equal to 1 and generates a calibrated error signal in which the above-mentioned compensation voltage is superimposed, as the offset voltage, on the amplified error signal. The error signal output by the voltage follower 51 is supplied to the comparator 5 shown in FIG. 15, and compared with the triangular wave signal having the fixed amplitude and fixed period. Then, the comparator 5 outputs the pulse width modulated signal. It should be noted that the central potential of the triangular wave signal is fixed, but instead the D.C. level (offset voltage) of the error signal varies in accordance with the aforementioned compensation voltage. Thereby, the second embodiment of the present invention has advantages which are almost the same as those of the first embodiment thereof. It will be noted that the error signal is changed so that the level thereof changes in the direction opposite to the direction in which the central potential of the triangular wave signal obtained in the first embodiment changes in response to a variation in the power supply voltage +B.

The triangular wave signal used in each of the first and second embodiments may be replaced by a sawtooth wave signal. It is necessary to use a slope wave having a fixed period and a fixed amplitude. The pulse width modulation circuit of the present invention is not limited to the solenoid valve driving device in the power steering control device, but a device in which the duty ratio is controlled.

The present invention is not limited to the specifically disclosed embodiments, and variations and modifications may be made without departing from the scope of the present invention.

What is claimed is:
1. A pulse width modulation circuit comprising:
   error amplifier means for generating an error signal corresponding to a difference between an input signal and a compare signal;
   operation means for generating a compensation signal based on a product of a deviation of said input signal from a first reference value and a deviation of a power supply voltage from a second reference value;

reference wave signal generating means for generating a reference wave signal having a fixed period and a fixed amplitude;

level change means, operatively coupled to said error amplifier means and said reference wave signal generating means, for changing a level of at least one of said error signal and said reference wave signal in accordance with said compensation signal so that a relative level defined by a level difference between said error signal and said reference wave signal changes in accordance with said compensation signal;

compare means, operatively coupled to said level change means, for comparing the level of the error signal and the level of said reference wave signal having a changed relative level with each other and for generating a pulse width modulated signal based on a comparison result;

current supply means, coupled to said compare means, for supplying a load current based on a duty ratio of said pulse width modulated signal to a load; and load current detection means, operatively coupled to said error amplifier means, for detecting said load current passing through said load and for generating said compare signal based on a detected load current.

2. A pulse width modulation circuit as claimed in claim 1, wherein said level change means comprises means for changing a central potential of said reference wave signal in accordance with said compensation signal generated by said operation means.

3. A pulse width modulation circuit as claimed in claim 1, wherein said level change means comprises means for changing a direct current level of said error signal in accordance with said compensation signal generated by said operation means.

4. A pulse width modulation circuit as claimed in claim 1, wherein:

said reference wave signal generating means has a control terminal;

said level change means comprises means for outputting a compensation voltage based on said compensation signal to said control terminal; and said reference wave signal generating means generates said reference wave signal which is biased by said compensation voltage.

5. A pulse width modulation circuit as claimed in claim 4, wherein said means of said level change means comprises a resistor network which includes a plurality of resistors connected in series, a first intermediate node receiving said compensation signal, and a second intermediate node outputting said compensation voltage.

6. A pulse width modulation circuit as claimed in claim 1, wherein said level change means comprises offset means for adding an offset voltage based on said compensation signal to said error signal generated by said error amplifier means.

7. A pulse width modulation circuit as claimed in claim 1, wherein said operation means comprises:

first differential amplifier means for generating a first current based on said input signal and said first reference value;

second differential amplifier means, coupled to said first differential amplifier in series, for receiving said first current and for generating a second current based on said power supply voltage and said second reference value; and output means, operatively coupled to said second differential amplifier means, for generating said compensation signal from said second current.

8. A pulse width modulation circuit as claimed in claim 1, wherein said first reference value corresponds to a level of said input signal obtained when said pulse width modulated signal has a duty ratio of 50%.

9. A pulse width modulation circuit as claimed in claim 1, wherein:

said load current detection means comprises a resistor through which said load current passes; and said detected load current corresponds to a voltage drop developed across said resistor.

10. A pulse width modulation circuit as claimed in claim 1, wherein said reference wave signal generating means comprises means for generating a triangular wave signal corresponding to said reference wave signal.

11. A pulse width modulation circuit as claimed in claim 1, wherein said reference wave signal generating means comprises means for generating a sawtooth wave signal corresponding to said reference wave signal.

12. A pulse width modulation circuit as claimed in claim 1, wherein said load comprises a solenoid coil.

13. A pulse width modulation circuit as claimed in claim 1, wherein said input signal indicates a speed of an automotive vehicle.

* * * * *

UNITED STATES PATENT AND TRADEMARK OFFICE
CERTIFICATE OF CORRECTION

PATENT NO. : 5,113,158
DATED : May 12, 1992
INVENTOR(S) : TSUJI et al

It is certified that error appears in the above-identified patent and that said Letters Patent is hereby corrected as shown below:

On the title page:

Add the following:

Foreign Application Priority Data:

Jul. 2, 1990(JP)   Japan. . . .2-175030
    Apr. 26, 1991 (JP)    Japan . . . . .3-097327--.

Signed and Sealed this

Twenty-first Day of September, 1993

Attest:

BRUCE LEHMAN

Attesting Officer     Commissioner of Patents and Trademarks